United States Patent
Satheesh et al.

(10) Patent No.: US 10,263,507 B2
(45) Date of Patent: Apr. 16, 2019

(54) METHOD FOR CORRECTING EFFECT OF SATURATION IN CURRENT TRANSFORMER AND AN INTELLIGENT ELECTRONIC DEVICE THEREFOR

(71) Applicant: ABB Schweiz AG, Baden (CH)

(72) Inventors: Hariram Satheesh, Bangalore (IN); Mallikarjun Kande, Bangalore (IN); Rahul Gore, Satura (IN); Simi Valsan, Ernakulam (IN)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/740,139

(22) PCT Filed: May 10, 2016

(86) PCT No.: PCT/IB2016/052646
§ 371 (c)(1),
(2) Date: Dec. 27, 2017

(87) PCT Pub. No.: WO2017/001950
PCT Pub. Date: Jan. 5, 2017

(65) Prior Publication Data
US 2018/0191241 A1    Jul. 5, 2018

(30) Foreign Application Priority Data
Jun. 29, 2015   (IN) .......................... 3299/CHE/2015

(51) Int. Cl.
*H02M 1/40*    (2007.01)
*G01R 15/18*   (2006.01)
(Continued)

(52) U.S. Cl.
CPC ............ *H02M 1/40* (2013.01); *G01R 15/183* (2013.01); *G01R 19/20* (2013.01); *G01R 35/007* (2013.01); *G05F 3/02* (2013.01)

(58) Field of Classification Search
None
See application file for complete search history.

(56) References Cited

U.S. PATENT DOCUMENTS

| 6,617,839 B2 | 9/2003 | Kang et al. |
| 7,127,364 B2 | 10/2006 | Kang et al. |

(Continued)

FOREIGN PATENT DOCUMENTS

| EP | 0 980 129 A2 | 2/2000 |
| WO | 93/13581 A1 | 7/1993 |

OTHER PUBLICATIONS

Li et al., "Combined wavelet transform and regression technique for secondary current compensation of current transformers", IEE Proceedings: Generation, Transmission and Distribution, vol. 149, No. 4, May 27, 2002, pp. 197-503.

(Continued)

*Primary Examiner* — Jeffrey A Gblende
(74) *Attorney, Agent, or Firm* — Barnes & Thornburg LLP (57) ABSTRACT

A method for generating corrected measured current in an Intelligent Electronic Device (IED) that is a true representation of primary current in an electrical network is disclosed. The method uses regression and a first threshold on measured sampled values from CT to detect a deviation instance that indicates a possibility of saturation. Wavelet and second threshold based detection of instances of saturation is then done. Then a regression based correction that uses a dynamic correction factor is implemented in real time to obtain corrected sampled values i.e. corrected measured current. Ending of correction is done based upon a predetermined selection criterion, The generated corrected measured current is used for protection and control functions in the IED. A CT output re-generation module as a functional (Continued)

module in the IED for implementing the method as described above is also disclosed.

10 Claims, 7 Drawing Sheets

(51) Int. Cl.
    *G01R 19/20*         (2006.01)
    *G01R 35/00*         (2006.01)
    *G05F 3/02*          (2006.01)

(56) References Cited

U.S. PATENT DOCUMENTS

| | | | |
|---|---|---|---|
| 8,395,373 B2 | 3/2013 | Akke et al. | |
| 2003/0057939 A1 | 3/2003 | Kang et al. | |
| 2005/0094344 A1 | 5/2005 | Kang et al. | |
| 2008/0246507 A1* | 10/2008 | Gunn | H02G 7/00 324/764.01 |
| 2009/0072813 A1* | 3/2009 | Banhegyesi | G01R 15/183 324/127 |
| 2009/0115509 A1* | 5/2009 | Minteer | H03F 3/387 330/10 |
| 2011/0025303 A1 | 2/2011 | Akke et al. | |
| 2012/0187770 A1* | 7/2012 | Slota | H02J 3/42 307/87 |
| 2016/0140263 A1* | 5/2016 | Rojas | G06F 17/5009 703/18 |

OTHER PUBLICATIONS

M.M. Eissa, "Improvement of the differential busbar characteristic to avoid false operation during to CT saturation", IET Generation, Transmission and Distribution, vol. 6, No. 10, Oct. 1, 2012, pp. 931-939.

Hong et al., "Compensation of Distorted Secondary Current Caused by Saturation and Remamence in a Current Transformer", IEEE Transactions on Power Delivery, vol. 25, No. 1, Jan. 1, 2010, pp. 47-54.

M.M. Eissa, "A novel wavelet approach to busbar protection during CT saturation and ratio-mismatch", Electric Power Systems Research, vol. 72, No. 1, Nov. 15, 2004, pp. 41-48.

A. Rahmati, "An adaptive differential relay for CT saturation based on wavelet transform", Transmission and Distribution Conference and Exposition, 2010 IEEE PES, Apr. 19, 2010, pp. 1-6.

Eldin Tag, "A new algorithm for the classification of different transient phenomena in power transformers combining Navelet transforms and fuzzy logic", Midwest Symposium on Circuits and Systems, vol. 3, Dec. 27, 2003, pp. 1116-1121.

International Preliminary Report on Patentability from PCT/IB2016/052646 dated Jan. 2, 2018, 6 pages.

Written Opinion of the International Searching Authority from PCT/IB2016/052646 dated Jan. 2, 2018, 5 pages.

International Search Report from PCT/1132016/052646 dated Aug. 7, 2016, 4 pages.

* cited by examiner

METHOD FOR CORRECTING EFFECT OF SATURATION IN CURRENT TRANSFORMER AND AN INTELLIGENT ELECTRONIC DEVICE THEREFOR

CROSS-REFERENCE TO RELATED APPLICATIONS

This application is a U.S. national stage of International Application Serial No. PCT/IB2016/052646, filed May 10, 2016, which claims priority to Indian Patent Application No. 3299/CHE/2015, filed Jun. 29, 2015. The entire disclosures of both of the foregoing applications are hereby incorporated by reference.

FIELD OF THE INVENTION AND USE OF INVENTION

The invention generally relates to the field of electrical network management carried out using intelligent electronic devices that receive an input from a current transformer (CT), and more specifically to monitoring, detecting and correcting effect of saturation in the CT output.

PRIOR ART AND PROBLEM TO BE SOLVED

High value of electric current flowing in an electrical network have to be transformed to a lower level to make it suitable for electronic measurement, monitoring, and control and protection applications of power equipment in the electrical network. Usually a Current Transformer (CT) is used for this transformation, with the primary winding terminals of the CT connected in the electrical network for measurement of the electric current flowing through the primary windings of the CT and the secondary winding terminals having a lower level of electrical current that is corresponding to the primary current in the CT, flowing in the secondary when shorted with a shunt.

During faults and disturbances, due of very high electrical current flowing through the CT, the core of the CT can saturate. This results in generation of a saturated secondary signal as an output at the secondary terminals of the CT, thereby having a condition of incorrect representation of the electric current flowing in the electrical network. This core saturation phenomenon can adversely affects all the measuring, monitoring and protection applications that rely on the current output from CT.

Intelligent electronic devices (IEDs) are commonly deployed for protection and control function in the electrical network. Several functional devices are implemented using IEDs and they use the CT current output for various protection and control decisions and actions. Since, the output of the CT may not indicate the true current in the electric network during the fault and disturbance condition, adequate protection and control decisions implemented through the IEDs get affected, which results in damage of equipment connected in the electrical network.

Some known approaches include CT saturation detection, wherein if saturation is detected, the information is used to restrain/adapt the relays (IEDs) that depend on the CT data. Some other methods use artificial intelligence techniques like neural networks to detect CT saturation wherein huge amount of past data is required to train the neural network. Some such methods are described herein below.

U.S. Pat. No. 6,617,839B2 gives a method for detection of waveform distortions due to CT saturation, but does not give any technique for the correction of the same. U.S. Pat. No. 7,127,364B2 talks about a CT saturation correction method wherein the data from unsaturated portion of the waveform is used to develop an Auto-Regressive (AR) model and extracts the co-efficients which is further used for correction of the saturated portion of the waveform. This method is quite computationally intensive and may not actually be suitable for low-end IEDs and for applications that has stringent real time requirements. EP0980129A2 gives a solution for CT saturation correction based on Artificial Neural Networks (ANN). These ANNs have to be pre-trained for use in such a scenario. The training typically needs huge amount of data and has to be re-trained for deployment in different situations. US2011025303A1 and WO9313581A1 also talk about some CT saturation correction mechanisms, but not from a point of view of their application to use scenarios for immediate use by IEDs, where the accuracy, computational burden and real time requirements are all critical.

A better solution of detecting saturation condition and to correct measurement error due to saturation provided for IEDs is needed. IEDs have their own challenge of low spare computational power and limited number of samples per cycle and the solution provided for IEDs need to overcome these challenges. There is therefore, a need for an efficient method to detect and correct measured current during CT saturation.

OBJECTS OF THE INVENTION

The requirement of accurate current information is critical during faults when there is a chance for the CT to get saturated, it is essential to find a method for real time detection and correction of CT saturation that ensures that IEDs work with a true representation of the primary current in the electrical network. The method disclosed here aims at detecting the saturation and correcting the same to give a correct representation of the primary current.

SUMMARY OF THE INVENTION

In one aspect, a method for generating a corrected measured current (46) in an intelligent electronic device (IED), where the corrected measured is representative of a primary current measured by a current transformer (CT) in an electrical network is disclosed. The corrected measured current is used in protection and control functions in the IED.

The method includes receiving sampled values of CT output (10) from the current transformer in a time sequence (11), where the sampled values are representative of actual value of CT output at discrete time instances.

The method then comprises applying regression (12) on the sampled values to obtain an estimated sampled value (14) at a given time instant in the time sequence, and determining a first error (18) by obtaining a difference between the estimated sampled value and an actual value at the given time (16). The method then includes a step of comparing the first error (18) with a first threshold (22) to identify a fault instance and to obtain sampled values in the time sequence occurring after the fault instance (24).

The method then includes a step for applying wavelet filtering (26) on the sampled values occurring after the fault instance (24), and to obtain one or more frequency contents (28) in the sampled values occurring after the fault instance. Next, the method includes comparing the one or more frequency contents (28) with a predetermined second threshold (32) to identify saturation instances (30) and obtaining sampled values at and after saturation instances (36, 36'). A dynamic correction factor (40) is determined by obtaining a difference between estimated sampled value and an actual sampled value at the fault instance (24) and at the saturation instances (36) respectively.

The method includes a step for correcting (42) the sampled values in the time sequence occurring after the saturation instances by using regression and the dynamic correction factor to obtain a corrected sampled value (44) after the saturation instances; and selecting (48) the corrected sampled value for generating the corrected measured current (50) based on a predetermined selection criterion, wherein the predetermined selection criterion is indicative of clearance of saturation in the CT output. Thus, the step for correcting (42) the sampled values in the time sequence occurring after the saturation instances by applying the regression model and the dynamic correction factor to obtain a corrected sampled value (44) during the one or more instances of saturation is achieved.

In another aspect a CT output re-generator module is disclosed as a specialized functional module in an IED to implement the method described herein above.

DRAWINGS

These and other features, aspects, and advantages of the present invention will become better understood when the following detailed description is read with reference to the accompanying drawings in which like reference numerals represent corresponding parts throughout the drawings, wherein.

DETAILED DESCRIPTION OF THE INVENTION

As used herein and in the claims, the singular forms "a", "an", and "the" include the plural reference unless the context clearly indicates otherwise.

To address the problem as described herein above, the method of the invention provides a solution to monitor the Current Transformer (CT) output (this includes direct output from current transformer or any derived signal that is representative of primary current in the CT), detect and correct CT saturation effect in the CT output using a computing/processing device such as an Intelligent Electronic Device (IED) that receives the CT output, corrects the CT output to re-generate a corrected measured current. Thus the corrected measured current can be regenerated in the TED by the way of processing and correcting the CT output that is a more accurate representation of the current flowing in the primary of the CT.

Figure 1:
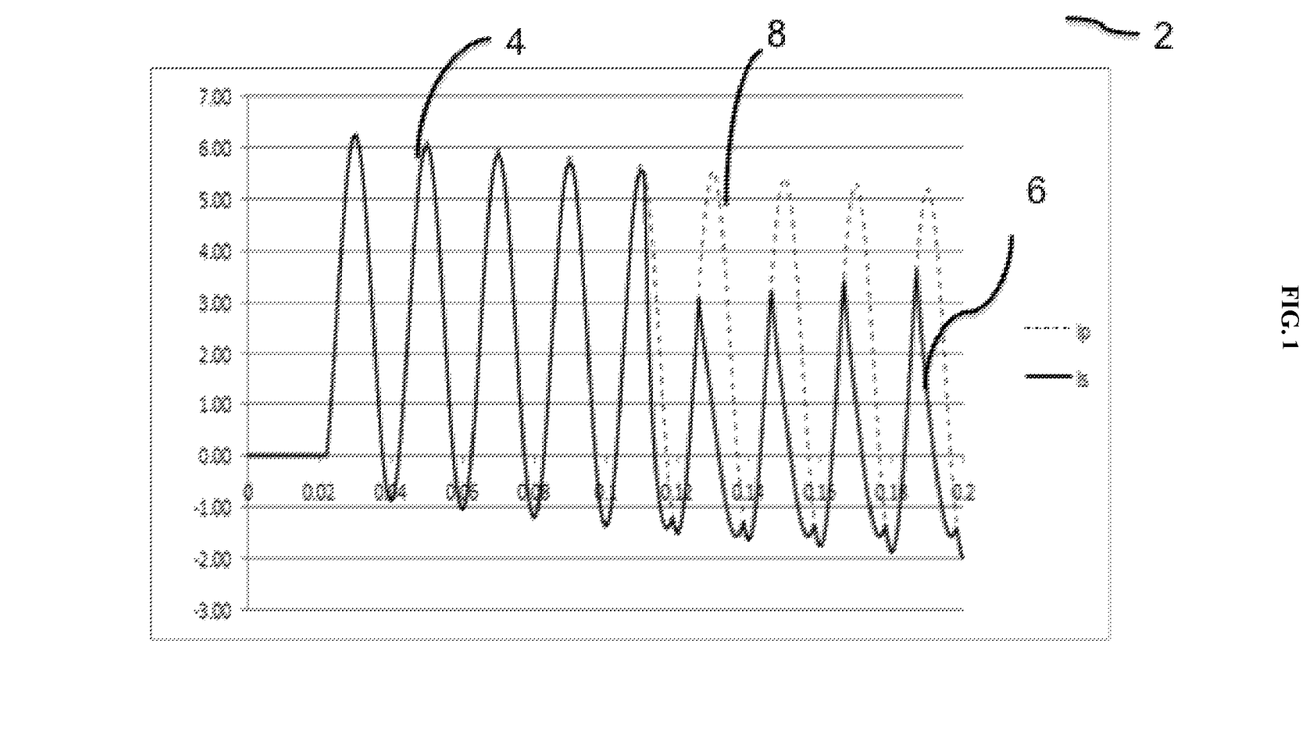
FIG. 1 is a waveform representation of CT output with saturation and corrected measured current that is desired output current according to an aspect of the invention.

FIG. 1 is a graphical representation 2 of Current Transformer (CT) output that saturates during measurement. The CT output (Is, current flowing in the secondary of the CT) includes a portion of measurement 4 that follows the waveform of simulated primary current (Ip, scaled down for depiction) and a saturated portion 6 that does not follow the waveform of simulated primary current. A portion indicated by reference numeral 8 is a representation of the primary current (expected secondary current) in the absence of saturation effect, and therefore, should have been the output from the CT. As mentioned herein this situation typically happens in fault scenarios or other disturbances where the primary current is very high, and CT gets saturated, distorting the transformed current flowing in the secondary winding. The output from the CT in these scenarios is not a true representation of the primary current in the electrical network, and therefore this mis-representation leads to incorrect feeding of electric current information to downstream devices and instruments (such as LEDs) that use the CT output for processing and control operations.

Figure 2:
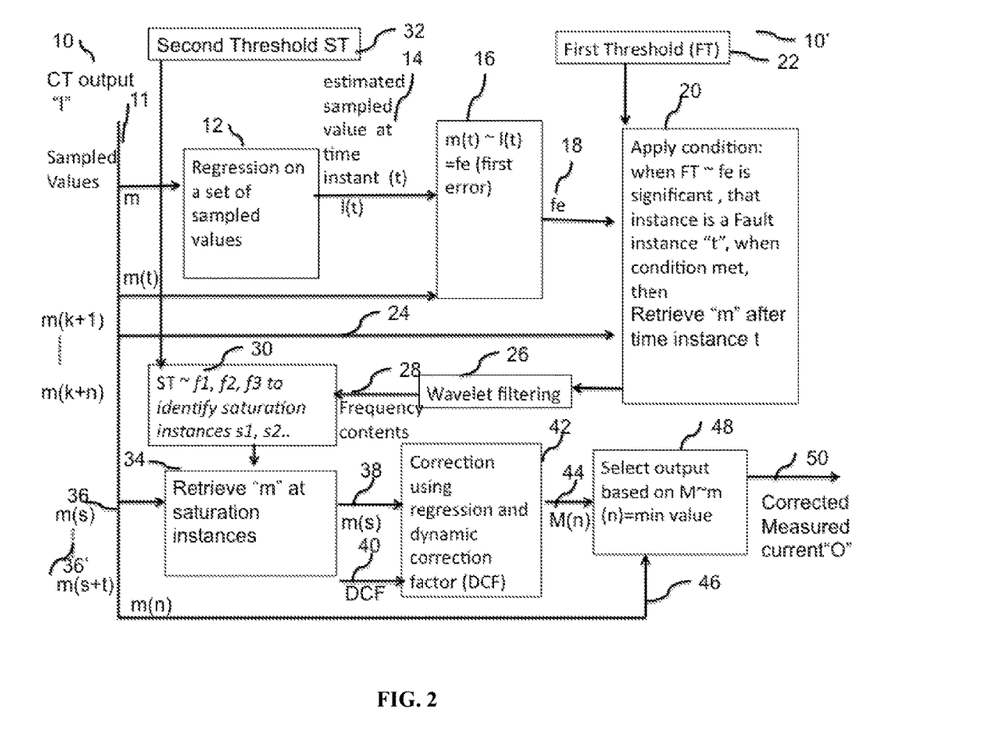
FIG. 2 is a block diagram representation showing the flow and implementation of a method for generating corrected measured current (46) in an intelligent electronic device (IED) using the method of the invention.

The overall method is shown in block diagram 10' of FIG. 2 that is implemented as a specialized functional module in an IED. Here, an IED is used as an exemplary processing device and the method can be performed with any other processing device that is used together with the CT. The TED is coupled to the current transformer from where it receives the CT output 10, and re-generates corrected measured current 50 (digitized sampled values or as analogue current value arrived from digital to analogue conversion). The corrected measured current 50 includes corrections for saturation effect in the CT and can be used for various substation functions, and protection and control functions in an electrical network as per the function of the IED. Such use, for further functions may be carried out by the same device i.e. the device performing the CT saturation correction (there may be no physical output of the corrected measured current but the values are used internally for further functions, e.g. in protection function the output of the IED is a trip signal to a circuit breaker based on processing of the corrected measured current), or/and by the other devices that receives the corrected measured current.

The method includes receiving by the IED, sampled values (11) of CT output (10) from the current transformer in real-time from CT, and buffering a set of sampled values for example, m (k), m (k+1), m (k+2) in a moving window (sequence of sampled values denoted by "k", where the sampled values are representative of actual value of CT output at discrete time instances (time aspect denoted generally by "t"). As mentioned earlier the sampling rate of IEDs can be low and is based on the power system specifications where the IEDs are deployed.

The method uses data modeling means such as regression techniques i.e. with model coefficients (regression coefficients), the method then comprises applying the regression coefficients (12) on the buffered set of sampled values (recent past values) to obtain an estimated sampled value (14) l(t) at an instance of time "t". It would be understood here that sampled valued in the set, m, m (k+1), m (k+2) will correspond to "t−3", "t−2", and "t−1" respectively.

The method then includes a step for determining a first error (18) (fe) by obtaining a difference (16) between the estimated sampled value l(t) at the instance of time "t" and an actual value m(t) at the same time instant "t". The method then includes a step for comparing i.e. calculating the difference between the first error (18) with a first threshold (22), which can be a fixed threshold or a refreshed threshold for each iteration of the set, to identify presence of significant deviation resulting because of a fault or any other disturbance. If the difference is significant, that instance "t" is identified as an instance of deviation, also referred herein as a fault instance (20). Alternately, instead of using a fixed threshold for error determination, in one implementation, the maximum error is tracked and if at any point it exceeds 3 or 5 times the tracked maximum error value, that point onwards, it is flagged as an occurrence of fault instance.

The identified fault instance is used to obtain sampled values occurring after the fault instance, for e.g. sampled values at time instances (t+1), (t+2), and so on and these sampled values are checked for any saturation effect. It would be appreciated by one skilled in the art that the saturation effect primarily occurs as a consequence of fault conditions when high current is flowing in the CT. Hence the sampled values after fault instance are monitored in the method of the invention for evaluating presence of saturation effect.

The further processing, in an exemplary implementation involves estimating a sign of the initial DC transient using data from one cycle of post fault occurrence, by getting the cumulative sample sum for estimated current. This is done to ensure determination of the exact location of the saturation instance i.e. improve the sensitivity and thereby lead to early detection of saturation. It would be appreciated by those skilled in the art that during fault, if negative DC transient is there and the saturation happens in negative half cycle, it will not be detected, as the threshold is positive. So in cases where negative DC transient is present, the filter output is multiplied with negative sign to make the algorithm work with improved sensitivity.

The equations below are used for error determination and calculation of first threshold.

$$i^{est}(n) = C1 + C2 \cdot i(n-1) + C3 \cdot i(n-3) \quad \text{Equation 1}$$

$$err(n) = |i(n) - i^{est}(n)| \quad \text{Equation 2}$$

$$sign(n) = ((i_{sum}(n) > 0)?1 : ((i_{sum}(n) < 0)? -1 : 0)) \quad \text{Equation 3}$$

C1, C2, C3 are exemplary predefined regression coefficients, selected from the table below according to the sampling rate for estimating CT output using the last two values of the CT output. In the equation, $i^{est}(n)$ is the estimated sampled value of CT output at the err(n) time instant (n), err(n) is the first error as mentioned earlier, used for detecting an instant of fault if any, and sign(n) is the sign of DC transient, and $i_{sum}(n)$ is the cumulative sum of estimated sampled values as mentioned hereinabove.

TABLE 1

Selection of Regression Co-efficients at different sampling rates.

| Coefficient | 80 samples/cycle | 32 samples/cycle | 20 samples/cycle |
|---|---|---|---|
| C1 | −3.33067E−16 | −5.55112E−17 | 7.107591884289E−17 |
| C2 | 1.492288568 | 1.451774982 | 1.37638192047117 |
| C3 | −0.501546099 | −0.509795579 | −0.525731112119133 |

Figure 3:
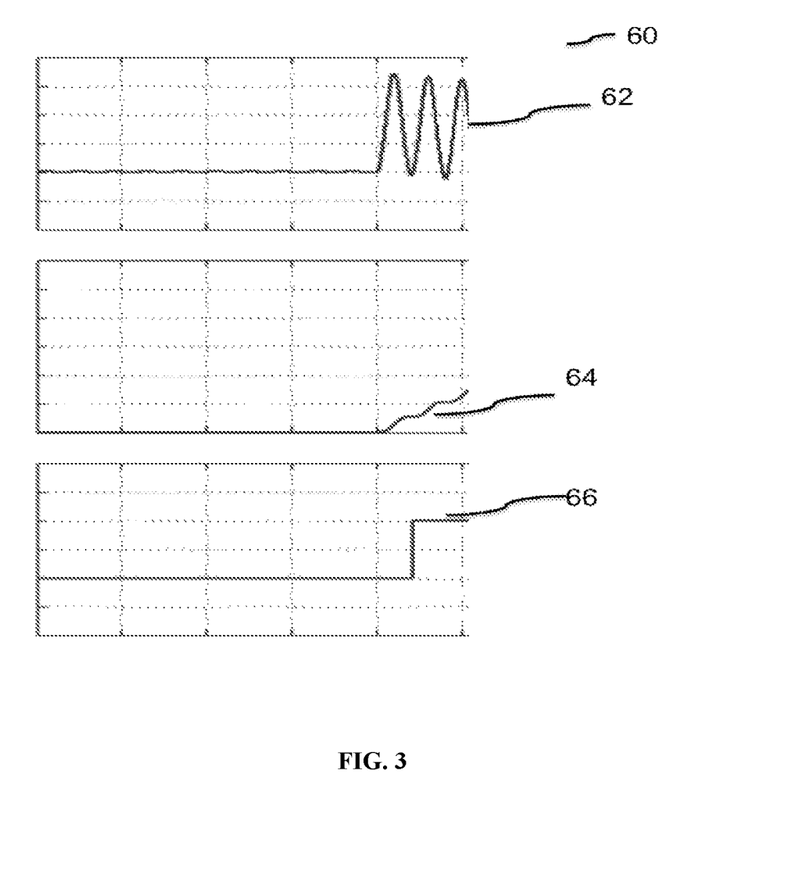
FIG. 3-6 are waveform representations at different steps of the method of invention relating to correction of saturation in CT output.

Referring to exemplary waveform illustration 60 in FIG. 3, waveform 62 shows the CT output signal i(n), waveforms 64 and 66 give the cumulative sum isum(n) and sign(n) signals as mentioned herein above respectively.

Referring back to FIG. 2, the method then includes a step for applying wavelet filtering (26) on the sampled values (24) in the sampled value sequence i.e. the sampled values occurring after the identified fault instance, and to obtain one or more frequency contents (28) and associated details in the sampled values occurring after the fault instance. In one implementation a finite impulse response high pass filter is used for wavelet filtering. It would be understood by those skilled in the art that the frequency contents are high frequency details, and these are extracted in one implementation using wavelet filter as follows, where wavelet filter coefficients h1, h2, h3, h4 are used with the sampled values at time instants n, n−1, n−2, and n−3:

$$\text{filt\_out}(n) = h1 \cdot i(n) + h2 \cdot i(n-1) + h3 \cdot i(n-2) + h4 \cdot i(n-3) \quad \text{Equation 4}$$

In an exemplary implementation, a Daubechies db-3 based high frequency filter is used to detect the saturation instances. This is not a limitation as any suitable transform can be applied. The high frequency decomposition filter coefficients (referred as auto generated filter coefficients h1, h2, h3, h4) used in one exemplary implementation are given in the table below:

TABLE 2

Exemplary Wavelet filter co-efficients

| Coefficient | Value |
|---|---|
| h 1 | −0.4829 |
| h 2 | 0.8365 |
| h 3 | −0.2241 |
| h 4 | −0.1294 |

Next, the method includes comparing the one or more frequency contents (28) with a predetermined second threshold (32) to identify saturation instances (30) where the frequency contents are beyond the second threshold and obtaining, as shown by reference numeral (34) sampled values (36 . . . 36') at and after saturation instances. These are the sampled values of interest where the correction needs to be applied.

Referring to Equation 4, wavelet filtering is updated (modified), i.e. filt out(n) is modified as filt out mod(n) for more accuracy, as follows: till the sign estimation from Equation 3 is unavailable e.g. in first cycle, absolute value of filt out(n) is used for comparison with the second threshold and once sign estimation is available, filt out(n) multiplied with sign is compared with the second threshold. An initial estimate of the second threshold for use in first cycle after the fault instance is pre-calculated as follows:

(i) The maximum analog input is assumed as 5V (ii) Apply a sine wave of peak amplitude 5V with required sampling rate is applied to the wavelet filter (iii) Find the peak value of the resulting output and add tolerance The initial value of second threshold "TH_start" is determined using the pre-determined values such as 0.03 for sampling rate 80 samples/cycle, 0.15 for sampling rate 32 samples/cycle, and 0.35 for sampling rate 20 samples/cycle The use of the initial value as mentioned herein above, for second threshold TH_start helps in detecting early saturation (within the first half cycle after fault) or severe saturation even before the active threshold value (real time value for second threshold) is evaluated on-line. It would be appreciated by those skilled in the art that the online calculated threshold value will be available after a cycle post fault. Saturation can start in the first cycle itself. TH_start helps to identify early saturation by providing a starting threshold to be used in the first cycle when the second calculated threshold is not yet available. The active threshold value TH1 (n) is fixed as the maximum of the absolute value of wavelet filter coefficients obtained from the second half cycle of the corrected measured current waveform immediately after the fault detection.

The CT saturation detection signal disc_out(n) goes high whenever the high frequency details i.e. the frequency contents, filt_out mod(n) obtained as explained above, exceeds the second threshold, TH(n).

$$\text{disc\_out}(n)=((\text{filt\_out\_mod}(n)>TH(n))?1:0) \quad \text{Equation 6}$$

Figure 4:
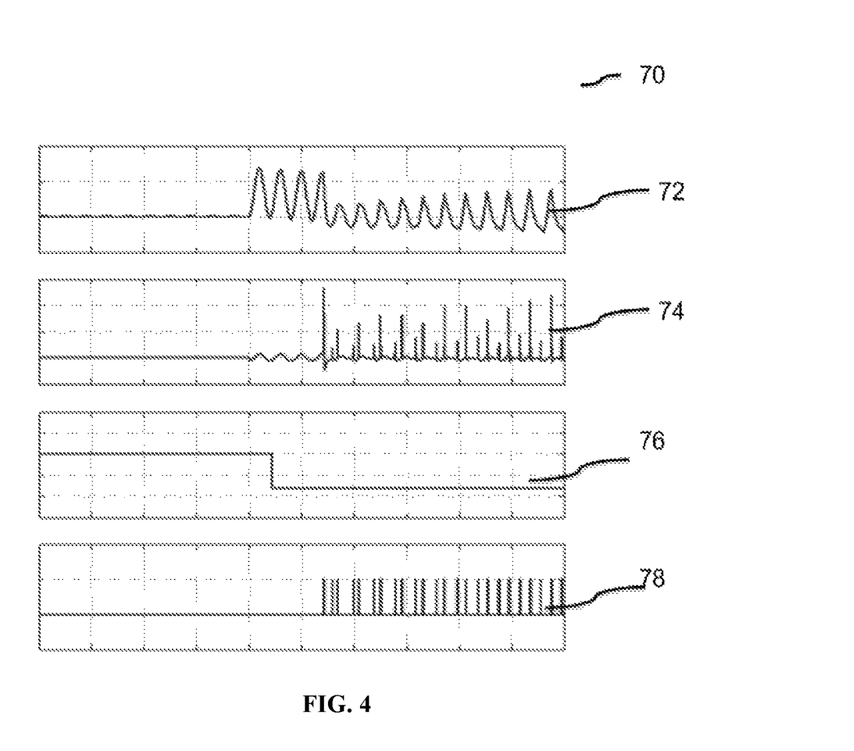

Waveforms 70 in the FIG. 4 shows the CT output i(n) 72 along with filt out(n) 74, TH(n) 76 and disc_out(n) 78.

Referring back to FIG. 2, a dynamic correction factor (40) is then determined by obtaining a difference between estimated sampled value and an actual sampled value at the instances of deviations as explained herein above, that would include fault instance (24) and the saturation instances (36) respectively. The method then includes a step for correcting (42) the sampled values occurring after the saturation instances (38) by using regression and the dynamic correction factor to obtain a corrected sampled value (44) after the saturation instances.

It would be appreciated by those skilled in the art that since CT output also includes DC transients, the dynamic correction factor is applied which in one exemplary implementation is estimated on-line and obtained as given below, where corrected (n−1) and corrected (n−3) refer to corrected measured sampled values at time instances (n−1) and (n−3) respectively:

$$i^{est}(n)=C1+\text{Corrected}(n-1)*C2+\text{Corrected}(n-3)*C3 \quad \text{Equation 7}$$

$$K\_\text{corr}(n)=i^{est}(n)-i(n) \quad \text{Equation 8}$$

Figure 5:
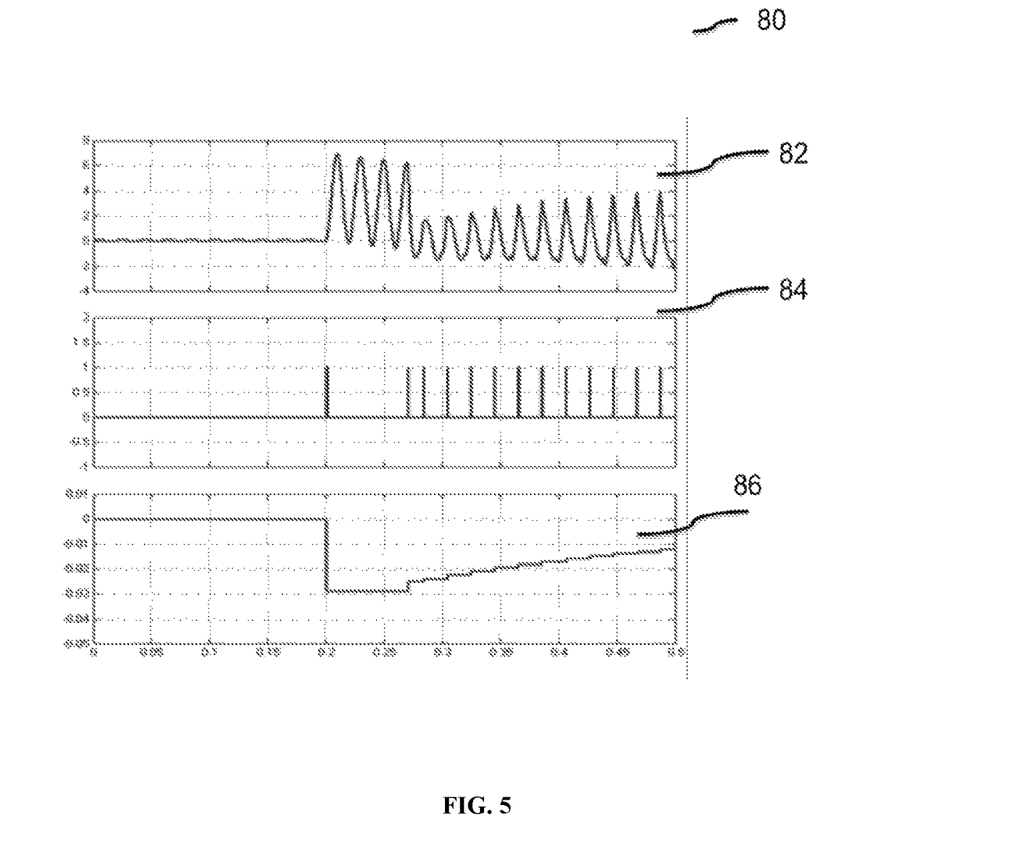

The dynamic correction factor K corr(n) is updated once at the start of the fault and every time saturation is detected and is shown in waveform 86 in FIG. 5 (82 indicates the CT output, 84 indicates the saturation instances).

Referring back to FIG. 2, the corrected sampled value is selected to re-generate the corrected measured current (50), and the end of correction is done based on a predetermined selection criterion. The predetermined selection criterion mentioned herein is indicative of clearance of saturation in the measured current, and is based on saturation detection signal, Det(n), where Det(n) goes high at the onset of saturation in each cycle and goes low based on conditions (i) to (iv) explained below. In one embodiment, the predetermined selection criterion uses a difference between the corrected sampled value and an actual sampled value (46) at the same time instant to detect a difference between the two. As the difference between these two values approaches a minimal value (predefined threshold value), the method stops using the corrected sampled value and switches to using the sampled value of CT output in the corrected measured current.

The end of correction point for each cycle i.e. clearance of sample is derived based on the following steps where information from the difference between actual CT output and corrected measured current are employed. The predetermined selection criterion used in one implementation included:
(i) the saturation correction is kept on for the first few cycles in case of severe saturation, irrespective of the difference between actual CT output and corrected measured current.
(ii) the saturation correction is turned off if the difference between corrected measured current and CT output reduces to minimum value.
(iii) the saturation correction is turned off or stopped if saturation is detected where the difference between actual CT output and corrected measured current is decreasing.
iv) To prevent correction from overflowing to adjacent cycles, the end of saturation correction has to be forced to remain in the present cycle so that enough samples of the original CT output is available for dynamic correction factor, K corr(n) evaluation (minimum 5 samples). This is achieved by forcing the saturation detection signal Det(n) to zero after it has remained high for a predetermined number, 'x' number of samples. 'x' is 85% for 80 samples/cycle (68 samples), 80% for 32 samples/cycle (25 samples) and 70% for 20 samples/cycle (14 samples).

The area of waveform for which correction has to be carried out is marked by Det(n) evaluated using the above selection criterion.

Finally, the corrected sampled value, i*(n), is given by $$i^*(n)=i(n)*(\text{NOT}(\text{Enbl}(n-6)\text{AND}\text{Det}(n)))+\text{Det}(n)*(i^{est}(n)-K\_\text{corr}(n)) \quad \text{Equation 9}$$

Figure 6:
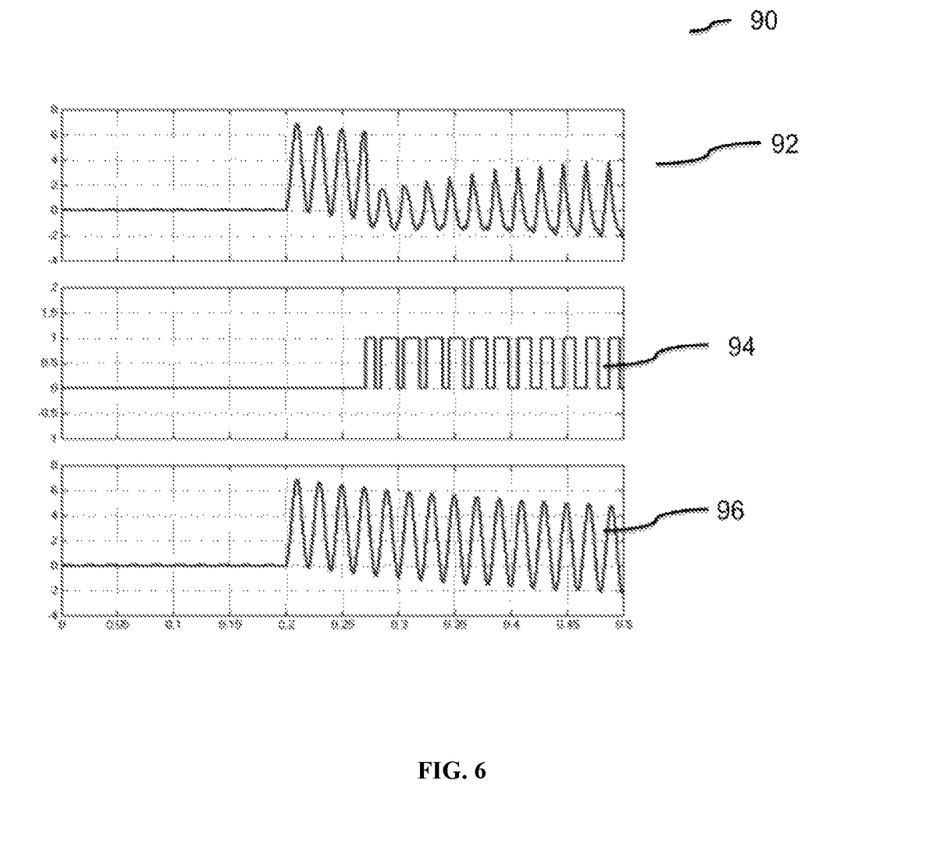

The CT output 92, saturation portion 94 and the corrected measured current waveforms 96 are shown in waveform 90 in FIG. 6.

It would be appreciated by one skilled in the art that the method described herein above provides a real-time CT saturation correction scheme which can be used even with TEDs and low end devices having low sampling rates and lesser computational capability. The tests conducted on various CT models show that even in the absence of end of saturation indicator, the method works well at different sampling rates in presence of remnant flux and harmonic distortions. Further, the method disclosed herein is suitable for real time/online application. Further advantages include that the number of computations involved are less and are non-intensive. The pre-determined AR (auto regression) coefficients are used which depend only on the sampling frequency. The method disclosed gives better accuracy when compared to the results available in literature.

Figure 7:
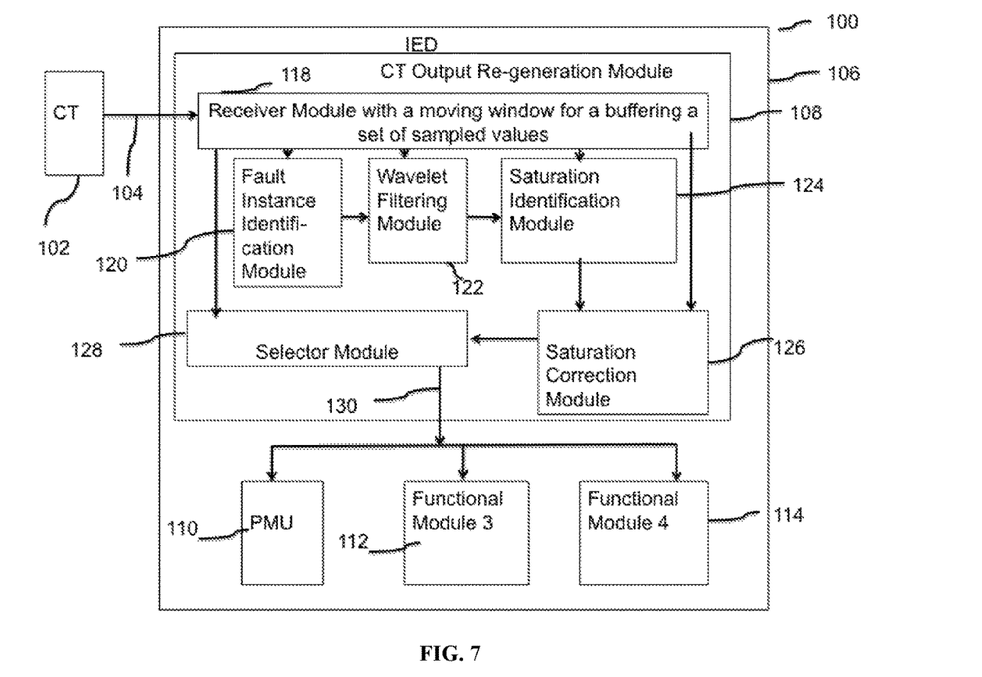
FIG. 7 is a block diagram representation showing the CT and CT output re-generator in an IED.

In another aspect of the invention, a CT output re-generation module is disclosed as a specialized functional module in an IED to implement the method described herein above. The block diagram 100 of FIG. 7 shows a CT 102 for generating the CT output 104, an IED 106 that includes several functional modules including the CT output re-generation module 108, and other low end protection and control devices whose functions are based on the measured current, such a Phasor Measurement Unit (PMU) 110, and other such functional devices (or modules) 112 . . . 114 which may be based on the measured current example digital protective relays, monitoring devices etc.

The CT output re-generation module 108 includes a receiver module 118 to receive sampled values of CT output from the current transformer in a time sequence as mentioned in reference to the method of the invention, and includes a moving window for buffering a set of sampled values. A deviation identification module 120 is provided to identify instances of deviation using regression on the buffered set of sampled value to estimate a sampled value at a time instance "t", calculating a difference between the estimated sampled value and an actual sampled value at that time instance "t", applying a threshold on this difference, and if the difference is beyond the threshold, identifying that instance as an instance of deviation. The deviation detection module also include extra steps to provide more sensitivity to the selection of deviation by accounting for the DC transients, as explained in the method of the invention. A wavelet filtering module 122 is provided to apply wavelet filtering on the sampled values occurring after the fault instance, to obtain one or more frequency contents and related details in the sampled values. A saturation identification module 124 is provided to identify saturation instances using the frequency contents from the wavelet filtering module and applying a second threshold as mentioned in the method steps of the invention, and to obtain sampled values in the time sequence at and after saturation instances.

A saturation correction module 126 is provided to obtain a corrected sampled value by correcting the sampled values occurring after the saturation instances by using regression and a dynamic correction factor, wherein the dynamic correction factor is a difference between estimated sampled value and an actual sampled value at the fault instance and at the saturation instances respectively. The saturation correction module thus corrects the portion of CT output which exhibits saturation. The correction is carried out on-line/real-time, thus enabling the subsequent functionalities which depend on the CT output information to perform correctly.

A selector module 128 is provided to select the corrected sampled value to re-generate the corrected measured current 130, and to end the correction based on a predetermined selection criterion, as explained in reference to the method, where the predetermined selection criterion is indicative of clearance of saturation in the CT output, and is mentioned in reference to the method of the invention.

The device (IED) performs the method of the invention as described with FIG. 2, and operates in a continuous manner checking each cycle of the CT output to ensure that whenever saturation occurs, the system is able to detect and correct the same, so that the functional modules in TED receive accurate reflection of the primary current in the electrical network. As would be understood to those skilled in the art the functional modules can also be one or more devices such as Phasor Measurement Units, Protective relays and other such devices.

The described embodiments may be implemented as a system, method, apparatus or article of manufacture using standard programming and engineering techniques related to software, firmware, hardware, or any combination thereof. The described operations may be implemented as code maintained in a "computer readable non-transitory medium", where a processor may read and execute the code from the computer readable medium. A computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. The code implementing the described operations may further be implemented in hardware logic (e.g. an integrated circuit chip, Programmable Gate Array (PGA), Application Specific Integrated Circuit (ASIC), etc.). An "article of manufacture" is a non-transitory "article of manufacture" that comprises computer readable medium, hardware logic, or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the present invention, and that the article of manufacture may comprise suitable information bearing medium known in the art.

A computer program code for carrying out operations or functions or logic or algorithms on tangible non-transitory memory of a computing device may be written in any combination of one or more programming languages which are either already in use or may be developed in future.

The different modules referred herein may use a data storage unit or data storage device. A computer network may be used for allowing interaction between two or more electronic devices or modules, and includes any form of inter/intra enterprise environment such as the world wide web, Local Area Network (LAN), Wide Area Network (WAN), Storage Area Network (SAN) or any form of Intranet or any specific electrical automation environment.

While only certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A method for correcting saturation in a current transformer (CT) with an intelligent electronic device (IED), wherein the IED is coupled to the current transformer to receive a current signal from the current transformer, the method being performed in the IED, the method comprising:
   obtaining, in real-time, sampled values of the current signal from the current transformer and buffering a set of the sampled values of the current signal in a moving window;
   obtaining an estimated value for the current signal using the buffered set of sampled values;
   determining a first error by obtaining a difference between the estimated value for the current signal and a sampled value of the current signal;
   comparing the first error with a first threshold to identify a deviation and a time instance corresponding to an inception of the deviation;
   applying wavelet filtering on the sampled values occurring after the time instance corresponding to the inception of the deviation, to obtain one or more frequency contents in the sampled values occurring after the inception of the deviation;
   comparing the one or more frequency contents with a predetermined second threshold to detect saturation and identify one or more instances of saturation;
   determining a correction factor by obtaining a difference between an estimated value for the current signal and sampled value of the current signal upon detection of saturation;
   correcting the sampled values occurring after the one or more instances of saturation by applying a regression model and the correction factor to obtain corrected sampled values for the one or more instances of saturation.

2. The method of claim 1, wherein applying the regression model comprises using a plurality of predetermined regression coefficients.

3. The method of claim 2, wherein the plurality of predetermined regression coefficients are derived from a unit sine wave at a sampling frequency of an output of the CT.

4. The method of claim 1, wherein the first threshold is at least one of a predefined first threshold or a rule-based first threshold to determine the inception of the deviation.

5. The method of claim 1, wherein the wavelet filtering is performed using a finite impulse response high pass filter having predefined wavelet coefficients.

6. The method of claim 1, wherein the predetermined second threshold is derived using a defined second threshold corresponding to a sampling frequency of an output of the CT in a first half cycle after the inception of the deviation and a maximum value of the one or more frequency contents calculated in a second half cycle after the inception of the deviation beyond the first half cycle.

7. An intelligent electronic device (IED) for correcting saturation in a current transformer (CT) coupled to the IED, and for generating corrected measured current, where the corrected measured current is representative of a primary current measured by the CT in an electrical network, and wherein the corrected measured current is used in protection and control functions in the IED, the IED comprising:

a receiver module to receive, in real-time, sampled values of a current signal from the CT and to buffer a set of sampled values in a moving window, wherein the sampled values are representative of actual values of an output of the CT at discrete time instances;

a deviation identification module for obtaining an estimated value for the current signal using the buffered set of sampled values, determining a first error by obtaining a difference between the estimated value for the current signal and a sampled value of the current signal, comparing the first error with a first threshold to identify a deviation and a time instance corresponding to an inception of the deviation;

a wavelet filtering module to apply wavelet filtering on the sampled values occurring after the time instance corresponding to the inception of the deviation, to obtain one or more frequency contents in the sampled values occurring after the inception of the deviation;

a saturation identification module to detect saturation and identify one or more instances of saturation by comparing the one or more frequency contents with a predetermined second threshold;

a saturation correction module to obtain corrected sampled values by correcting the sampled values occurring after the one or more instances of saturation by using regression and a correction factor, wherein the correction factor is a difference between an estimated value for the current signal and a sampled value of the current signal upon detection of saturation; and a selector module to select the corrected sampled values to re-generate the corrected measured current based on a predetermined selection criterion, wherein the predetermined selection criterion is indicative of clearance of saturation in the output of the CT.

8. The IED of claim 7, wherein the deviation identification module comprises programmable instructions for applying regression on the sampled values.

9. The IED of claim 7, wherein the wavelet filtering is performed using a finite impulse response high pass filter having predefined wavelet coefficients.

10. The IED of claim 7, wherein the predetermined second threshold is derived using a defined second threshold corresponding to a sampling frequency of the output of the CT in a first half cycle after the inception of the deviation and a maximum value of the one or more frequency contents in a second half cycle after the inception of the deviation.

* * * * *